(12) United States Patent
Nakamura et al.

(10) Patent No.: US 7,180,114 B2
(45) Date of Patent: Feb. 20, 2007

(54) SEMICONDUCTOR DEVICE

(75) Inventors: Mitsutoshi Nakamura, Yokohama (JP); Hirotaka Amakawa, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/874,306

(22) Filed: Jun. 24, 2004

(65) Prior Publication Data

US 2005/0205953 A1 Sep. 22, 2005

(30) Foreign Application Priority Data

Mar. 22, 2004 (JP) ............................. 2004-083227

(51) Int. Cl.
*H01L 23/556* (2006.01)
(52) U.S. Cl. ............................. 257/297; 257/E23.115
(58) Field of Classification Search .................. 257/48, 257/659, 660, 787, 789, 795, 294, 422, 435, 257/69, 70, 297, 348, 353, E23.115; 438/215, 438/124, 126, 127, 48, 70, 422, 436
See application file for complete search history.

(56) References Cited

U.S. PATENT DOCUMENTS

| | | | | |
|---|---|---|---|---|
| 5,807,771 A * | 9/1998 | Vu et al. | ..................... | 438/154 |
| 6,097,081 A * | 8/2000 | Masuda et al. | ............... | 257/666 |
| 6,239,479 B1 * | 5/2001 | Hwang et al. | ............... | 257/659 |
| 6,255,719 B1 * | 7/2001 | Kuriyama et al. | .......... | 257/659 |
| 6,268,630 B1 * | 7/2001 | Schwank et al. | ............ | 257/347 |
| 6,368,938 B1 * | 4/2002 | Usenko | ...................... | 438/407 |
| 6,525,402 B1 | 2/2003 | Matsumoto et al. | | |
| 6,633,061 B2 * | 10/2003 | Lutzen et al. | ................ | 257/305 |
| 6,849,385 B2 * | 2/2005 | Nagoya et al. | ........... | 430/283.1 |
| 2002/0076913 A1 * | 6/2002 | Lee | ............................ | 438/614 |
| 2003/0227058 A1 * | 12/2003 | Wang et al. | ................. | 257/347 |
| 2005/0074954 A1 * | 4/2005 | Yamanaka | ................... | 438/458 |

FOREIGN PATENT DOCUMENTS

| | | |
|---|---|---|
| JP | 8-330478 | 12/1996 |
| JP | 9-260427 | 10/1997 |
| JP | 11-354690 | 12/1999 |
| JP | 11354690 A2 * | 12/1999 |

OTHER PUBLICATIONS

Mendez et al., Amorphous Silicon Pixel Radiation Detectors And Associated TFT Electronics Readout, The Elect. Society Proc., vol. 94-35, pp. 356-369, 1995☐☐☐☐.*
S. Takagi et al., Japan J. Appl. Phs., vol. 37, p. 1289-1294, (1998).

(Continued)

*Primary Examiner*—Carl Whitehead, Jr.
*Assistant Examiner*—Jennifer M. Dolan
(74) *Attorney, Agent, or Firm*—Finnegan, Henderson, Farabow, Garrett & Dunner, L.L.P.

(57) ABSTRACT

A semiconductor device includes a silicon substrate having a film thickness smaller than a maximum range of a particle generated by a nuclear reaction between a fast neutron and a silicon atom, and a semiconductor element formed on a surface of the silicon substrate.

20 Claims, 11 Drawing Sheets

OTHER PUBLICATIONS

JEDEC Standard No. 89, "Measurement and Reporting of Alpha Particies and Terrestrial Cosmic Ray-Induced Soft Errors in Semi-conductor Devices," JEDEC Solid State Technology Association, 32 pages, Aug. 2001.
C. Dai, "Single -Event Effects: Soft Errors in Present and Future Semiconductor Technologies and Products," 38 pages.
Technorise.ne.jp/item/p2.html, 3 pages, [originally retrieved 2004, copy of enclosed reference retrieved Jun. 27, 2005].
Rao R. Tsummala et al., Chapter 6 "Connection of Chip and package," Microelectronics Packing Handbook, Nikkei BP, pp. 285-363 and coverpage, Kouyama translation (1991).
Avoid.co.jp/products/assem/basic.pdf, 8 pages.
Page 442 from Rao R. Tsummala et al., Microelectronics Packing Handbook, Nikkei BP, Kouyama translation (1991).

* cited by examiner

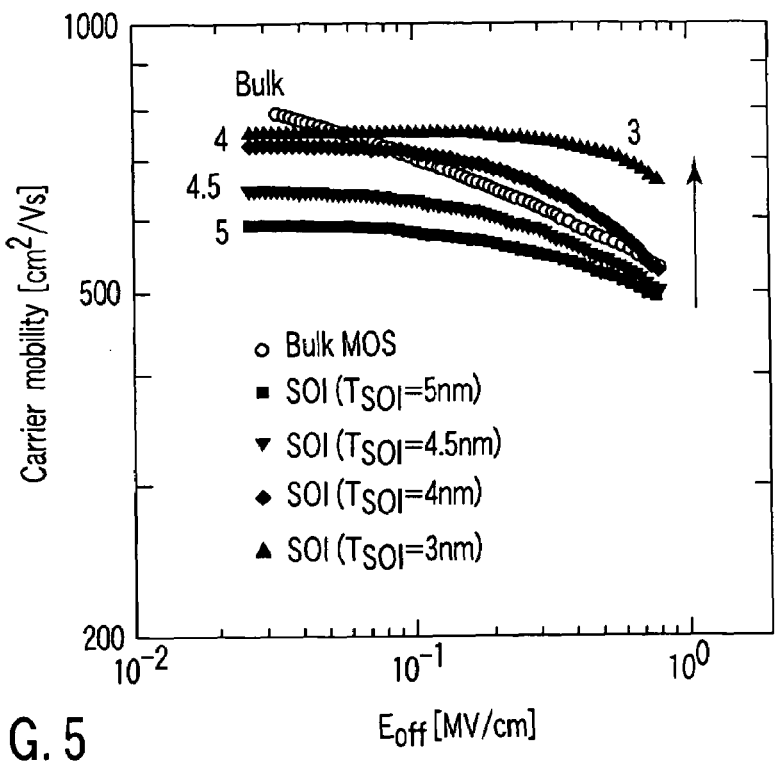
F I G. 5
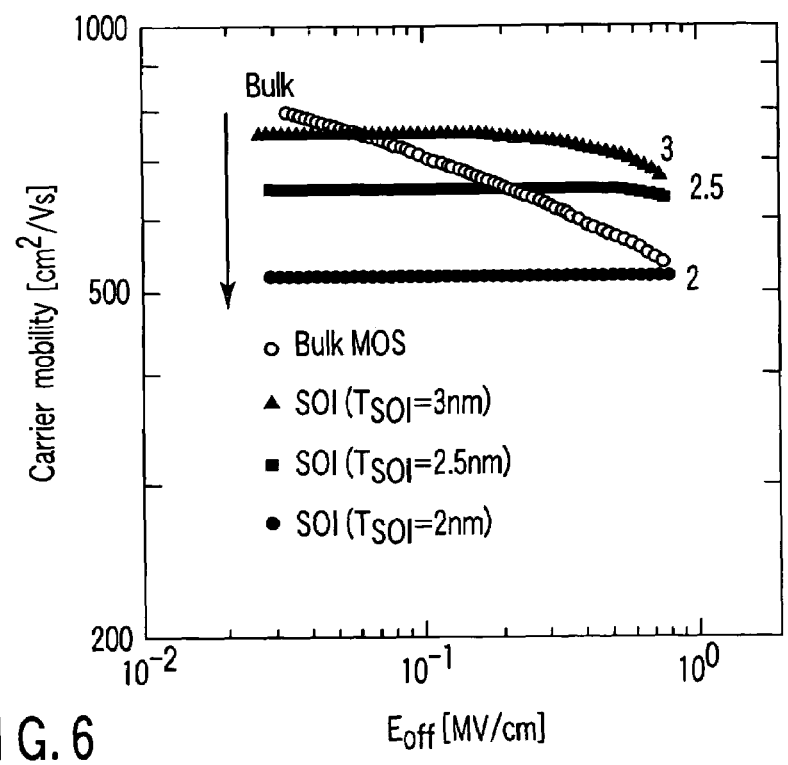
F I G. 6

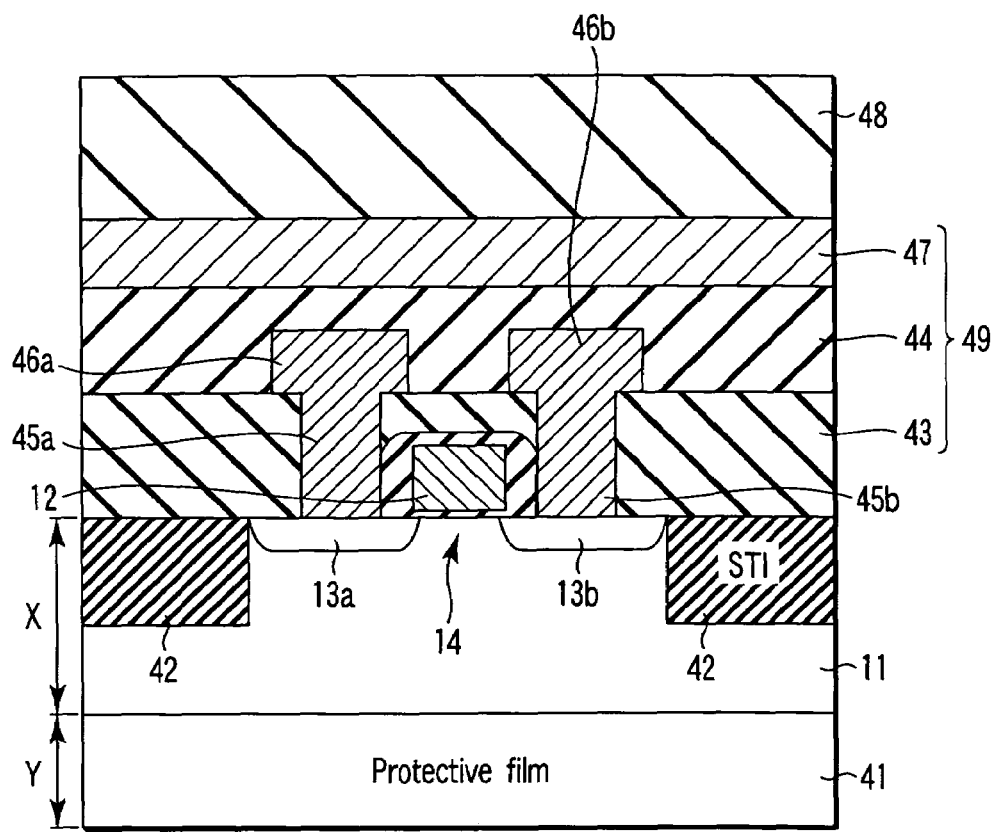
F I G. 15
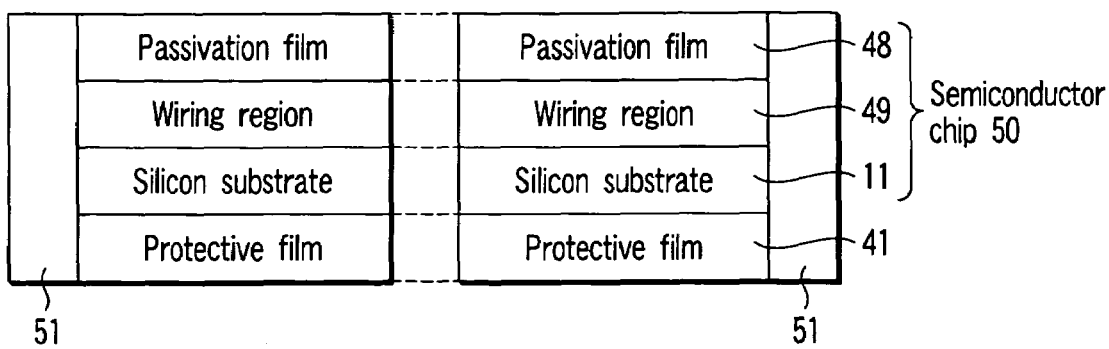
F I G. 16

| Manufacturer | Brand | Base resin | Filler | Type | Conductivity | Highest curing temperature (°C) | Adhesiveness (kg/mm2) | Remarks |
|---|---|---|---|---|---|---|---|---|
| Epotek | H20E | Epoxy | Silver powder | Two-pack type | Conductivity | 175 | 1.06 | High-thermal-conductivity conductive epoxy adhesive |
| | H20E-175 | Epoxy | Silver powder | Two-pack type | Conductivity | 180 | 1.06 | H20E high-purity high-Tg epoxy adhesive |
| | H35-175M | Epoxy | Silver powder | One-pack type | Conductivity | 180 | 1.27 | H20E one-pack epoxy adhesive |
| | H41 | Epoxy | Silver powder | One-pack type | Conductivity | 150 | 2.11 | Low-temperature-curing one-pack epoxy adhesive |
| | H44 | Epoxy | Gold powder | One-pack type | Conductivity | 150 | 2.11 | Gold powder filled one-pack epoxy adhesive |
| | H81E | Epoxy | Gold powder | Two-pack type | Conductivity | 150 | 0.91 | Gold powder filled two-pack epoxy adhesive |
| | P-1011 | Polyimide | Silver powder | One-pack type | Conductivity | 150 | 0.5 | Low-temperature-curing polyimide adhesive |
| Amicon | C-840-4 | Epoxy | Oxide | One-pack type | Conductivity | 200 | 1.6 | B-stage precure type high-purity epoxy adhesive |
| | C-868-1 | Epoxy | Oxide | One-pack type | Conductivity | 180 | 1.6 | Low-temperature-curing epoxy adhesive changeable into B-stage |
| | C-940-4 | Polyimide | Oxide | One-pack type | Conductivity | 270 | 1.45 | High-purity epoxy adhesive having heat-resistant to 400°C |
| | C-966 | Polyimide | Oxide | One-pack type | Conductivity | 180 | 2.5 | High-purity low-temperature-curing polyimide adhesive |
| | C-990 | Epoxy | Oxide | One-pack type | Conductivity | 275 | 1.55 | Fast-curing epoxy adhesive |
| | CT-4042 | Epoxy | Oxide | Two-pack type | Conductivity | 150 | 1.6 | High-purity two-pack epoxy adhesive |
| | ME-868 | Epoxy | Oxide | One-pack type | Insulating | 180 | 1.6 | Semi-insulating high-thermal-conductivity epoxy adhesive |
| Ablestic | 71-1 | Polyimide | Silver powder | One-pack type | Conductivity | 275 | 0.7 | Versatile polyimide adhesive |
| | 71-ILMI | Polyimide | Silver powder | One-pack type | Conductivity | 275 | 2.04 | 71-1 ultrahigh-purity adhesive |
| | 81-ILMI | Epoxy | Silver powder | One-pack type | Conductivity | 150 | 4.58 | High-purity low-temperature-curing epoxy adhesive |
| | 81-ILMI | Epoxy | Silver powder | One-pack type | Conductivity | 150 | 4.3 | 84-ILMI high-thermal-conductivity epoxy adhesive |
| | 84-IA | Epoxy | Silver powder | One-pack type | Conductivity | 200 | 4.22 | 84-ILMI fast-curing epoxy adhesive |
| | 81-ILMISI | Epoxy | Silver powder | One-pack type | Conductivity | 200 | 2.11 | 84-ILMI fast-curing epoxy adhesive |
| | 941-3 | Epoxy | Silver powder | One-pack type | Conductivity | 175 | 2.11 | Epoxy adhesive changeable into B-stage when printed on lead frame |

FIG. 18

SEMICONDUCTOR DEVICE

CROSS-REFERENCE TO RELATED APPLICATIONS

This application is based upon and claims the benefit of priority from prior Japanese Patent Application No. 2004-083227, filed Mar. 22, 2004, the entire contents of which are incorporated herein by reference.

BACKGROUND OF THE INVENTION

1. Field of the Invention

The present invention relates to a semiconductor device which reduces soft errors caused by fast neutrons.

2. Description of the Related Art

In an SRAM (Static Random Access Memory) and DRAM (Dynamic Random Access Memory) as semiconductor memories, a phenomenon in which held data is naturally destroyed occurs. This phenomenon is called a "soft error".

Known causes of soft errors are α-rays emitted from radioactive substances contained in materials such as solder used in a semiconductor device, and fast neutrons which come flying as cosmic rays.

Soft errors caused by α-rays can be avoided relatively easily by designing semiconductor elements beforehand, e.g., by reducing radioactive substances contained in a semiconductor device, or setting a film thickness such that no data destruction occurs even when α-rays enter. Also, the absolute amount of electron-hole pairs produced by a soft error caused by an α-ray is smaller than that of electron-hole pairs produced by a soft error caused by a fast neutron (to be described below). Soft errors caused by α-rays are easy to avoid in this sense, too.

On the other hand, a fast neutron which causes a soft error has almost no influence on a semiconductor device even when this fast neutron itself passes through Si (silicon). However, if a fast neutron collides with an Si atom in a semiconductor device to cause nuclear spallation, a secondary particle having an atomic number smaller than that of the collided Si atom is ejected, and electron-hole pairs are produced along the orbit of this secondary particle. That is, if this secondary particle penetrates by this p-n junction, electron-holes pairs produced along the orbit of the secondary particle move under the influence of a bias applied to the p-n junction, in the same manner as in soft errors caused by α-rays. As a consequence, these electron-hole pairs produce a noise current to cause an operation error of an element. This problem is more serious than soft errors caused by α-rays since the order of the absolute amount of electron-hole pairs generated in the process is large.

References pertaining to soft errors are patent references 1, 2, and 3 below.

[Patent Reference 1]
Jpn. Pat. Appln. KOKAI Publication No. 11-354690
[Patent Reference 2]
Jpn. Pat. Appln. KOKAI Publication No. 8-330478
[Patent Reference 3]
Jpn. Pat. Appln. KOKAI Publication No. 9-260427

BRIEF SUMMARY OF THE INVENTION

A semiconductor device according to an aspect of the present invention comprises a silicon substrate having a film thickness smaller than the maximum range of a particle generated by a nuclear reaction between a fast neutron and a silicon atom, and a semiconductor element formed on the surface of the silicon substrate.

BRIEF DESCRIPTION OF THE SEVERAL VIEWS OF THE DRAWING

FIG. 5 is a graph showing the relationships between the film thicknesses (3 to 5 nm) of SOI films and the carrier mobility according to the first embodiment of the present invention;

FIG. 6 is a graph showing the relationships between the film thicknesses (2 to 3 nm) of SOI films and the carrier mobility according to the first embodiment of the present invention;

FIG. 15 is a sectional view showing a semiconductor device according to the second embodiment of the present invention;

FIG. 16 is a sectional view showing a semiconductor chip including the semiconductor device according to the second embodiment of the present invention;

FIG. 18 is a view showing adhesives of the protective film according to the second embodiment of the present invention.

DETAILED DESCRIPTION OF THE INVENTION

Embodiments of the present invention will be described below with reference to the accompanying drawing.

[First Embodiment]

In the first embodiment, to reduce soft errors caused by fast neutrons, the thickness of a silicon substrate on which a semiconductor element is formed is made smaller than the maximum range of a particle generated by nuclear spallation of a silicon atom and a fast neutron. This silicon substrate will be explained in detail below.

(a) Thickness of Silicon Substrate

Figure 1:
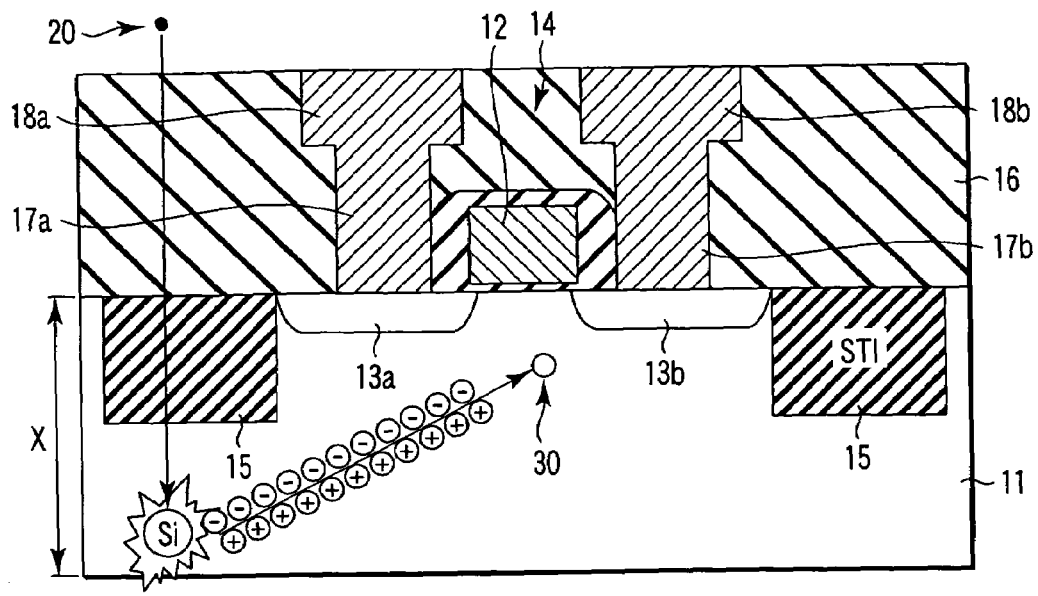
FIG. 1 is a sectional view showing a semiconductor device according to a first embodiment of the present invention.

FIG. 1 is a sectional view showing a semiconductor device according to the first embodiment of the present invention. As shown in FIG. 1, a gate electrode 12 is formed on a silicon substrate 11 via a gate insulating film, and source/drain diffusion layers 13a and 13b are formed in the silicon substrate 11 on the two sides of the gate electrode 12, thereby forming a MOSFET 14 as a semiconductor element. An element isolation region 15 having an STI (Shallow Trench Isolation) structure is formed in the silicon substrate 11, and an interlayer dielectric film 16 is formed on the silicon substrate 11. In the interlayer dielectric film 16, contacts 17a and 17b and interconnections 18a and 18b which connect to the source/drain diffusion layers 13a and 13b, respectively, are formed.

In this semiconductor device, if a fast neutron 20 collides with an Si atom in the silicon substrate 11 to cause a nuclear reaction (nuclear spallation), a secondary particle 30 having an atomic number smaller than that of the Si atom is generated. That is, a secondary particle 30 of any of H (hydrogen), He (helium), Li (lithium), Be (beryllium), B (boron), C (carbon), N (nitrogen), O (oxygen), F (fluorine), Ne (neon), Na (sodium), Mg (magnesium), and Al (aluminum) having atomic numbers 1 to 13 is generated. The secondary particle 30 may include the isotope of the Si atom. The secondary particle 30 springs out at an angle as shown in FIG. 2 and with energy as shown in FIG. 3 by the nuclear reaction.

Figure 2:
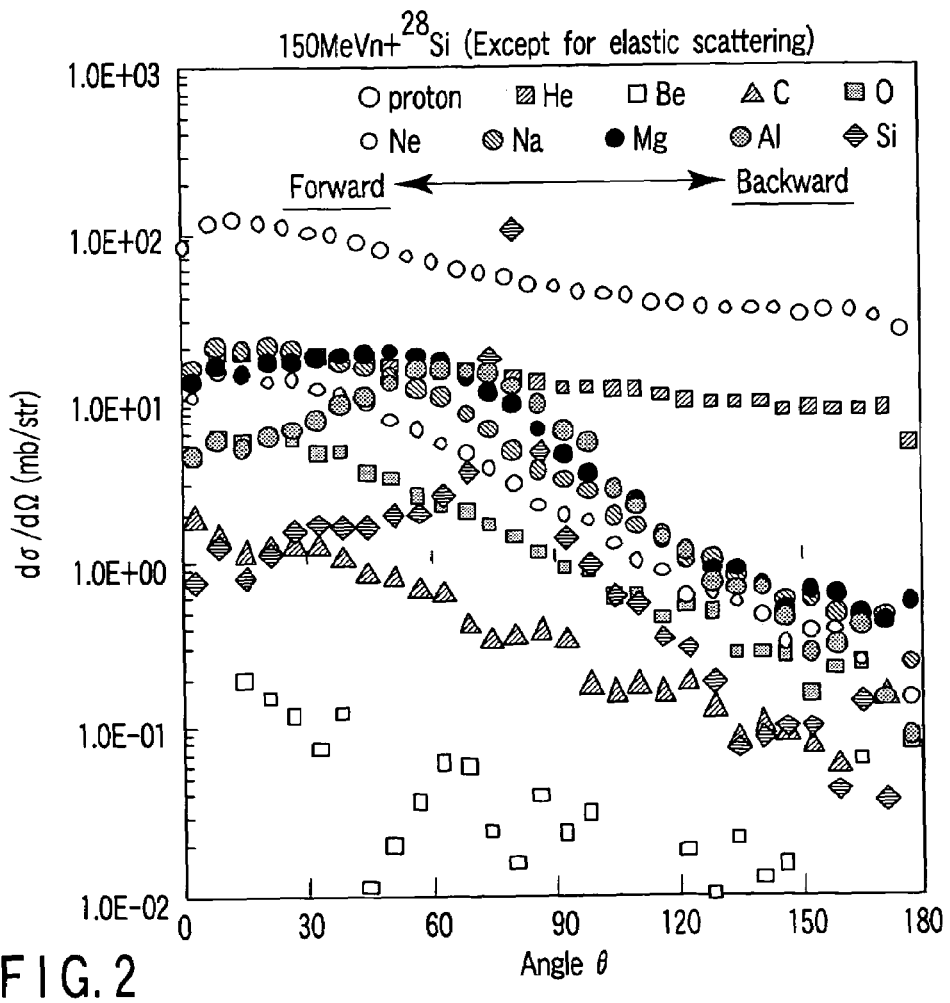
FIG. 2 is a graph showing angles at which secondary particles are ejected by a nuclear reaction according to the first embodiment of the present invention.
Figure 3:
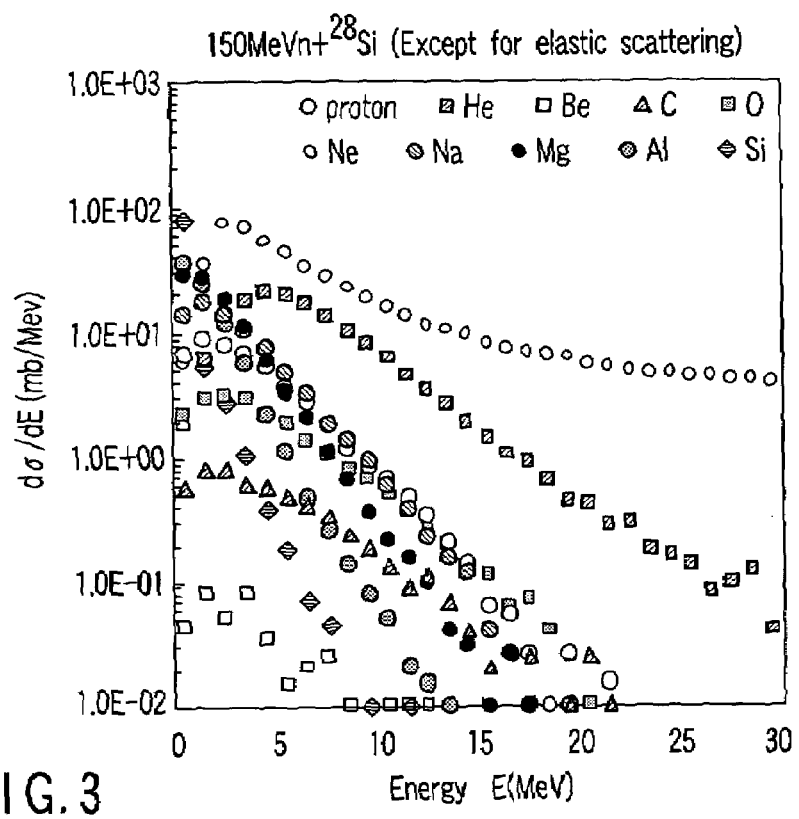
FIG. 3 is a graph showing energies with which secondary particles are ejected by a nuclear reaction according to the first embodiment of the present invention.

As shown in FIG. 2, α-particles (He) are ejected in substantially equal directions, and many heavy particles (Si) are ejected forward. Also, as shown in FIG. 3, the α-particles (He) have a larger amount of high-energy components than that of the heavy particles (Si). Accordingly, when a nuclear reaction occurs, the α-particle (He) presumably has the longest range of all the secondary particles 30. Since, therefore, the maximum range of the α particle (He) having an initial energy of 30 MeV is about 30 μm, a thickness X of the silicon substrate 11 is preferably, e.g., 30 μm or less.

Also, the thickness X of the silicon substrate 11 can be decreased to the minimum thickness by which a semiconductor element can be formed, as long as the thickness X is smaller than the maximum range (e.g., 30 μm) of secondary particles generated by nuclear spallation between a silicon atom and a fast neutron. For example, the thickness X is desirably 2 nm $\leq$ X $\leq$ 6 μm for the reasons explained below.

First, the reason why the thickness X of the silicon substrate 11 is desirably 2 nm or more will be described, with reference to FIGS. 4 to 6. From the viewpoint of soft errors, the thickness of the silicon substrate 11 is preferably as small as possible. In this embodiment, therefore, the minimum film thickness of the silicon substrate 11 is determined from another viewpoint.

Figure 4:
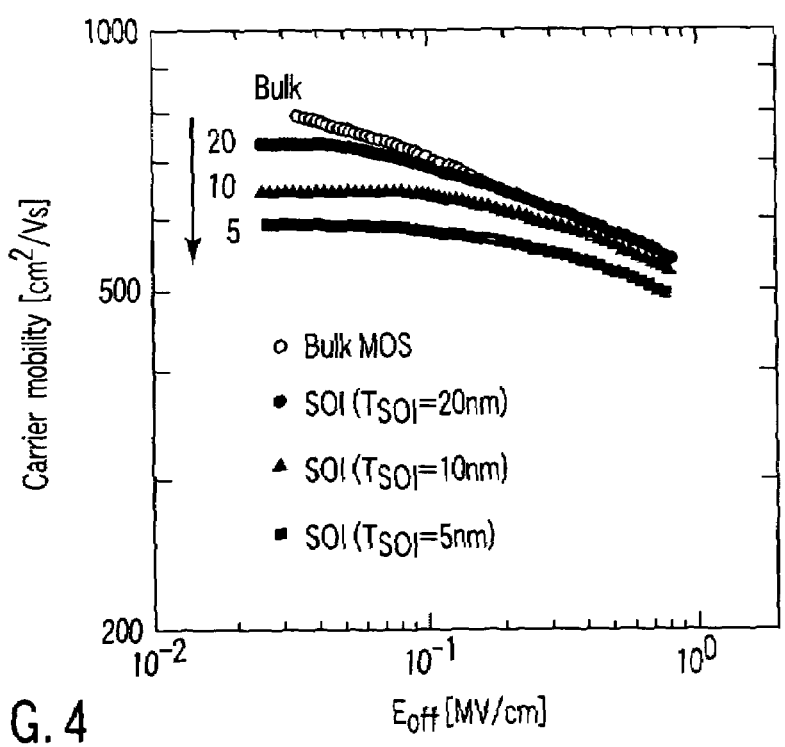
FIG. 4 is a graph showing the relationships between the film thicknesses (5 to 20 nm) of SOI films and the carrier mobility according to the first embodiment of the present invention.

FIGS. 4 to 6 illustrate the relationships between the film thicknesses of SOI (Silicon On Insulator) films and carrier mobility. These figures are disclosed in S. Takagi et. al., Jpn. J. Appl. Phys. 37, p. 1289 (1998). For more detailed information, therefore, see this reference.

As shown in FIGS. 4 to 6, according to theoretical calculations by S. Takagi et. al., when an SOI film is thinned in a MOSFET having an SOI structure, a subband is modulated, and the carrier mobility changes. That is, when the SOI film is thinned to about 20 to 5 nm, the carrier mobility decreases once (FIG. 4). The carrier mobility then increases when the SOI film is thinned to about 5 to 4 nm after that, and reaches the peak when the SOI film is about 3 nm thick (FIG. 5). When the SOI film is further thinned from 3 nm to about 2.5 to 2 nm, the carrier mobility decreases to that when the SOI film is about 5 nm thick (FIG. 6). When these relationships are taken into consideration, the thickness X of the silicon substrate 11 is presumably preferably 2 nm or more.

The reason why the thickness X of the silicon substrate 11 is desirably 6 μm or less will be explained below with reference to FIGS. 7 to 10.

In JESD89: "Measurement and Reporting of Alpha Particles and Terrestrial Cosmic Ray-Induced Soft Errors in Semiconductor Devices", page 44, of JEDEC as an electronic device-related standardization organization of the U.S.A., a standard mathematical expression for an SER (Soft Error Rate) is defined by $$SER/(\# \text{ of Bits}) = 3.86\sigma(14 \text{ MeV}) + 3.72\sigma(50 \text{ MeV}) + 1.83\sigma(100 \text{ MeV}) + 3.98\sigma(150 \text{ MeV}) \quad (1)$$

where σ indicates the SER cross section (the percentage defect per unit flux), and # indicates the number.

In equation (1), the device's SER caused by fast neutrons contained in cosmic rays is obtained by calculating the SER cross sections σ at energies of 14, 50, 100, and 150 MeV by irradiating the device with neutrons having these energies, and adding up these SER cross sections after weighting them. Of the four energies, 150 MeV has the largest weight. Therefore, the thickness of the silicon substrate 11 is determined by using data of the most heavily weighted 150-MeV neutron.

Figure 7:
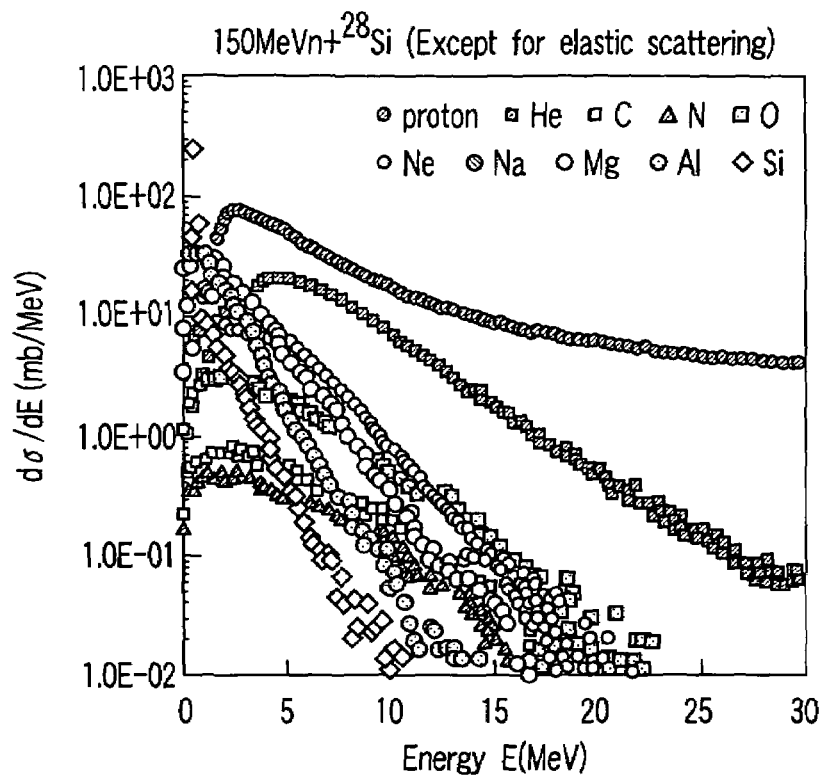
FIG. 7 is a graph showing differential cross sections produced by nuclear spallation when a 150-MeV neutron collides with an Si atom according to the first embodiment of the present invention.

FIG. 7 shows differential cross sections produced by nuclear spallation when 150-MeV neutrons collide with an Si atom. As shown in FIG. 7, according to the simulation of nuclear spallation caused by 150-MeV neutrons, a differential cross section with respect to the initial energy changes from one particle to another generated when the neutrons collide with an Si atom.

Figure 8:
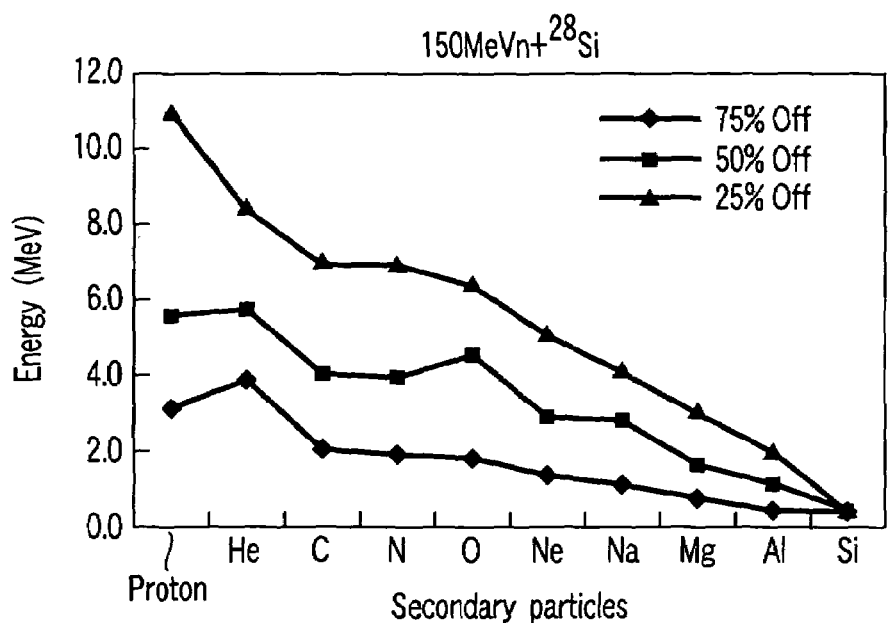
FIG. 8 is a graph showing energies when the generation amount of each particle shown in FIG. 7 reduces by 25%, 50%, and 75%.

FIG. 8 shows energies when the generation amount of each particle shown in FIG. 7 reduces by 25%, 50%, and 75%. Referring to FIG. 8, energies when the total number of generated particles reduces by 25%, 50%, and 0.75% from infinity to zero are calculated for each particle with respect to the distribution shown in FIG. 7.

Figure 9:
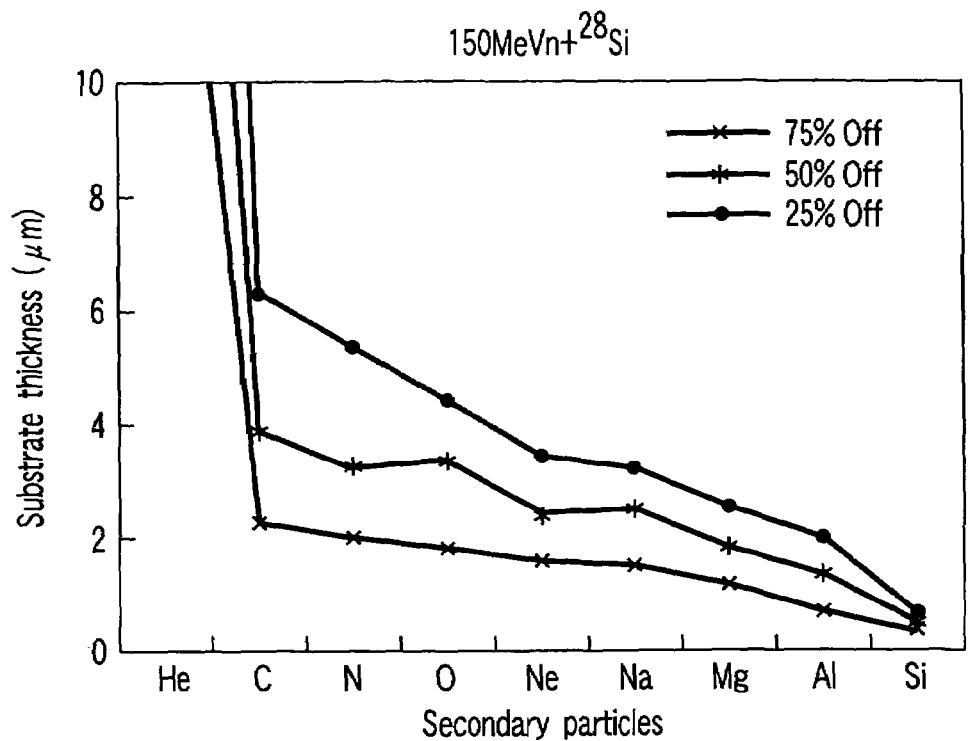
FIG. 9 is a graph showing the ranges of individual particles in Si with respect to the energies shown in FIG. 8.

FIG. 9 shows the ranges of individual particles in Si with respect to the energies shown in FIG. 8. Referring to FIG. 9, the average range of each particle in Si is calculated by assuming that the particle has the energies shown in FIG. 8 as initial velocities. Since the range of each particle can be regarded as the film thickness of the silicon substrate 11, the ordinate of FIG. 9 indicates the substrate thickness.

Figure 10:
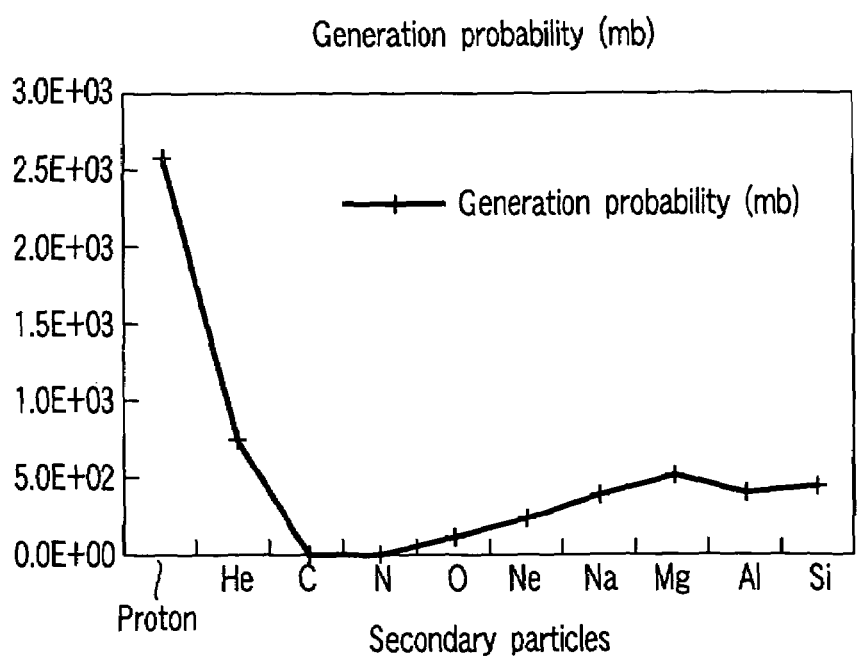
FIG. 10 is a graph showing differential cross sections produced by nuclear spallation when a 150-MeV neutron collides with an Si atom according to the first embodiment of the present invention.

FIG. 10 shows differential cross sections produced by nuclear spallation when 150-MeV neutrons collide with Si atom. Referring to FIG. 10, the cross section of each particle at 150 MeV is calculated by integrating the graph shown in FIG. 7 by the energy.

As shown in FIG. 10, particles having the largest and second largest cross sections are a proton and He atom. The sum of the cross sections of a proton and He atom are substantially equal to the sum of the cross sections particles having atomic numbers larger than that of C atom. Accordingly, the thickness of the silicon substrate 11 by which the generation amount of these particles is 25% or less is regarded as the maximum value of the substrate thickness. It is, therefore, only necessary to read from FIG. 9 a film thickness by which the generation amount of C atom is 75% (25% off), so the maximum value of the film thickness of the silicon substrate 11 is 6 μm.

Note that when only the SER is taken into consideration, the optimum film thickness of the silicon substrate 11 is a film thickness by which Si is 25% off in FIG. 9. In this case, therefore, an optimum value of the thickness X of the silicon substrate 11 is about 0.5 μm.

(b) Shape of Silicon Substrate

In the first embodiment, to reduce soft errors caused by fast neutrons, it is desirable to limit the silicon substrate 11 only to an element formation region, and not to form the silicon substrate 11 in other regions.

Figure 11:
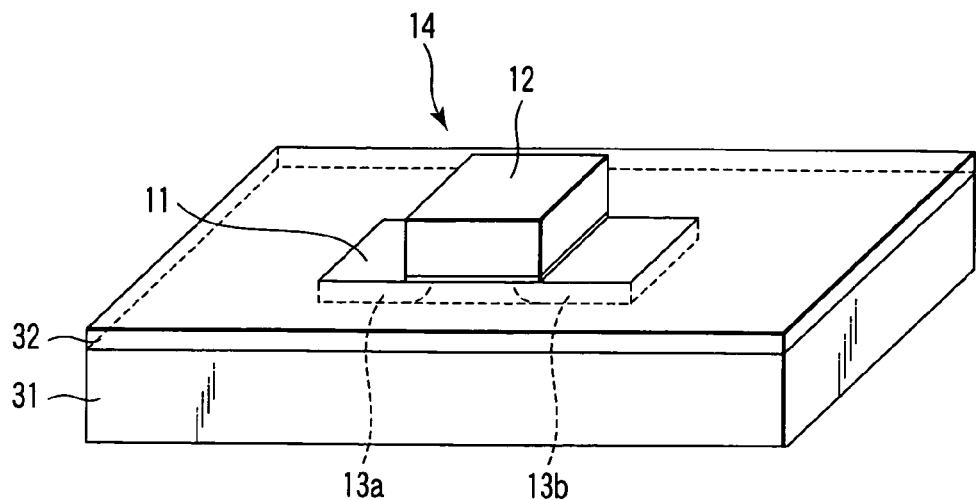
FIG. 11 is a perspective view showing a semiconductor device having an island-like silicon substrate according to the first embodiment of the present invention.

As shown in FIG. 11, therefore, the island-like silicon substrate 11 is formed on an insulating film 31, the MOSFET 14 is formed on the silicon substrate 11, and an insulating film 32 is formed around the silicon substrate 11. Accordingly, as in a structure using an SOI substrate, it is favorable to leave the silicon substrate 11 only in a region where the MOSFET 14 is to be formed, and form the insulating films 31 and 32 in other regions. Although the insulating films 31 and 32 are preferably formed by a protective film 41 (to be describe later), this will be explained in the second embodiment.

When the silicon substrate 11 is to be formed into the shape of an island, the planar shape viewed from above the substrate is not limited to a square as shown in FIG. 11, but can be variously changed in accordance with the LSI circuit design.

The shape of this silicon substrate 11 need not be rectangular. As long as the characteristics of the semiconductor element are not adversely affected, the silicon region farthest from the source/drain diffusion regions 13a and 13b can be shaved, so that this silicon region is smaller than the silicon region in which these source/drain diffusion regions 13a and 13b are formed.

In the first embodiment as described above, the thickness of the silicon substrate 11 on which a semiconductor element is formed is made smaller than the maximum range of the secondary particle 30 generated by nuclear spallation between a silicon atom and a fast neutron 20. This makes it possible to reduce the probability of passage of the secondary particle 30 in a sensitive region near, e.g., a p-n junction, and to reduce the amount of electron-hole pairs generated in the sensitive region even if the secondary particle 30 passes through the region. Consequently, soft errors caused by fast neutrons can be reduced.

[Second Embodiment]

The second embodiment further comprises a protective film formed by a material containing one of atoms having atomic numbers 1 to 13, in the semiconductor device of the first embodiment. This protective film will be described in detail below.

(a) Materials of Protective Film

A secondary particle generated by a nuclear reaction between a certain primary particle and a fast neutron has an atomic number smaller than that of the primary particle. That is, when a fast neutron collides with an Si atom to cause a nuclear reaction (nuclear spallation), all secondary particles having atomic numbers smaller than that of the Si atom can be generated. To reduce soft errors, therefore, it is effective to reduce the types of secondary particles which can be generated by the nuclear reaction.

Also, a relationship indicated by $$\sigma \propto \pi (1.2 \times A^{1/3})^2 \quad (2)$$

holds between the total cross section σ of the nuclear reaction and the mass number (the sum of the atomic number Z and the number N of neutrons) A. As indicated by equation (2), the total cross section σ of the nuclear reaction is proportional to the mass number A. Therefore, the smaller the mass number A, the fewer the types of secondary particles generated.

Figure 12:
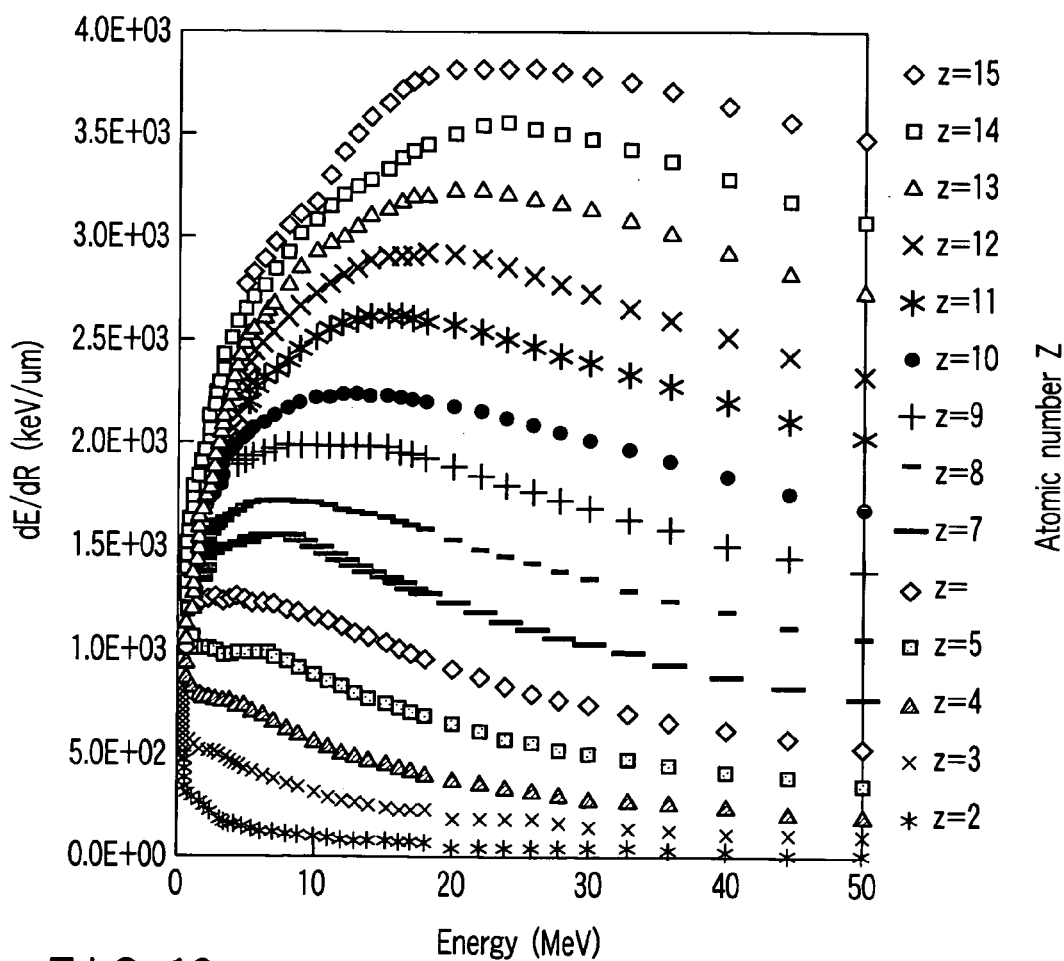
FIG. 12 is a graph showing the energy losses of atomic numbers according to a second embodiment of the present invention.

Also, as shown in FIG. 12, the larger the atomic number Z, the larger the energy loss per unit length. Generally, one electron-hole pair is generated for every energy loss of 3.6 eV; the larger the atomic number Z, the larger the number of electron-hole pairs generated. Accordingly, the atomic number of a secondary particle generated by the nuclear reaction is preferably as small as possible. For more detailed information of FIG. 12, see a reference having the following URL.

"lithonet.eecs.Berkeley.edu/variations/presentations/Intel_C.Dai_Soft%20Errors.pdf (hyperlink symbology omitted)"

On the basis of the above findings, the semiconductor device of the second embodiment includes a protective film formed by any of 13 atoms having atomic numbers smaller than that of an Si atom. In other words, the second embodiment includes a protective film formed by a material containing at least one of atoms having atomic numbers 1 to 13.

Figures 13, 14:
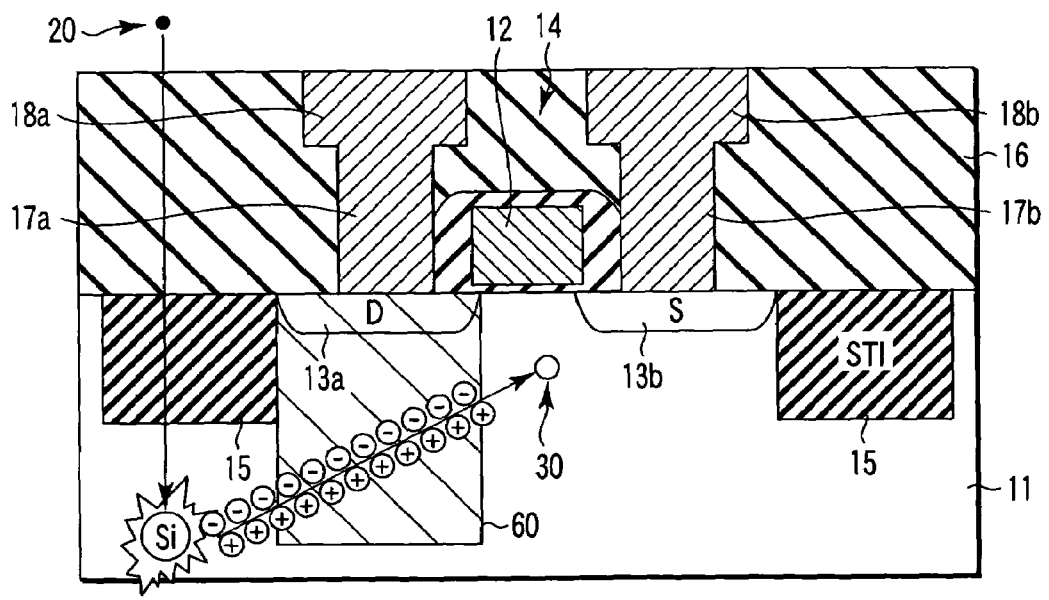
FIG. 13 is a graph showing an atomic number table according to the second embodiment of the present invention.
FIG. 14 is a sectional view showing a semiconductor device having a sensitive region according to the second embodiment of the present invention.

As shown in FIG. 13, the atoms having atomic numbers 1 to 13 are H (hydrogen), He (helium), Li (lithium), Be (beryllium), B (boron), C (carbon), N (nitrogen), O (oxygen), F (fluorine), Ne (neon), Na (sodium), Mg (magnesium), and Al (aluminum) in ascending order of atomic number. These atoms having atomic numbers 1 to 13 will be collectively referred to as the atom group 35.

The protective film can be formed by one atom of the atom group 35, or a plurality of atoms of the atom group 35. For example, the protective film is preferably formed by polyimide.

Note that in the atom group 35, the difference between the mass numbers (atomic number+number of neutrons) of isotopes having the same atomic number but different numbers of neutrons makes the obtained effects different from each other, but this difference is negligible. However, these isotopes must be atoms which do not cause any alpha decay.

Note also that in the atom group 35, the same effect can be obtained by different attributes, i.e., by metal elements (Li, Be, Na, Mg, and Al) and nonmetal elements (H, He, B, C, N, O, F, and Ne).

The protective film desirably contains no atoms except for the atom group 35. However, a slight amount (about a few percent) of atoms except for the atom group 35 can be contained. This will be explained below.

First, a sensitive region 60 shown in FIG. 14 is a region where all carriers generated in this region are collected via a p-n junction (in the structure shown in FIG. 14, these carriers are collected in a drain). By using this concept, the rate (fit ratio: Fit) at which a soft error occurs will be described.

If only one type of a secondary particle 30 is generated by a nuclear reaction, or if a plurality of types of secondary particles 30 are generated by a nuclear reaction but they can be effectively approximated to one type of particle by an operation such as averaging, the ratio (fit ratio: Fit) at which a soft error occurs when one type of atom is contained in a target film is represented by $$\text{Fit} = \alpha P_G P_P P_C \tag{3}$$

where $P_G$ is the generation probability of the secondary particle 30, $P_P$ is the probability of passage of the secondary particle 30 in the sensitive region 60, $P_C$ is the probability at which the total amount of charge generated in the sensitive region 60 exceeds the critical charge amount, and $\alpha$ is a proportional coefficient.

In equation (3), $P_G$ can be represented by $$P_G = \beta F_n \rho_t \sigma_r \tag{4}$$

where $F_n$ is the flux of a neutron incident on a target, $\rho_t$ is the density of a target film, $\sigma_r$ is the cross section of the secondary particle 30 generated by the nuclear reaction, and $\beta$ is a proportional constant.

If a plurality of types of atoms are contained in a target film, equation (4) is rewritten as $$P_G = \beta F_n \rho_t \sum_A r_A \sigma_r^A \tag{5}$$

where A is an atom contained in the target, $r_A$ is the composition ratio of the atom contained in the target (the relationship of equation (6) below holds), and $\sigma_r^A$ is the cross section of the secondary particle 30 generated by the nuclear reaction.

$$\sum_A r_A = 1 \tag{6}$$

From the above equations, when secondary particles generated by a nuclear reaction can be effectively approximated to one type, the fit ratio is represented by $$\text{Fit} \propto \sum_A r_A \sigma_r^A \tag{7}$$

Accordingly, if one type of atom other than the atom group 35 is mixed in the protective film, the fit ratio is represented by $$\text{Fit} \propto r_I \sigma_r^I + \sum_A r_A \sigma_r^A \tag{8}$$

where I is the atom, other than the atom group 35, which is mixed in the protective film, $r_I$ is the composition ratio (the relationship of equation (9) below holds if the film density is constant), and $\sigma_r^I$ is the cross section of the secondary particle 30 generated by the nuclear reaction.

$$r_I + \sum_A r_A = 1 \tag{9}$$

From the foregoing, an increment $\Delta$Fit of the fit ratio when an atom other than the atom group 35 is mixed in the protective film is represented by $$\Delta\text{Fit} \propto r_I \sigma_r^I \tag{10}$$

$\Delta$Fit is determined in accordance with the specifications of the semiconductor element. For example, if $\Delta$Fit is 1% or less of a pure film in which no atom other than the atom group 35 is mixed, $r_I$ is calculated by using equation (10) such that equation (12) below holds.

$$\frac{\Delta\text{Fit}}{\text{Fit}} \approx \frac{r_I \sigma_r^I}{\sum_A r_A \sigma_r^A} \leq 0.01 \tag{11}$$

$$r_I \leq 0.01 \frac{\sum_A r_A \sigma_r^A}{\sigma_r^I} \tag{12}$$

Furthermore, if the protective film is made up of one type of atom, $r_I$ is calculated by $$r_I \leq 0.01 \frac{\sigma_r^A}{\sigma_r^I} \tag{13}$$

For example, assuming that A is carbon 12, I is silicon 28, and a 150-keV neutron is incident, $r_I$ is calculated by $$r_I \leq 0.01 \frac{\sigma_r^A}{\sigma_r^I} = 0.01 \frac{237.1}{427.8} \approx 5.542E - 3 \tag{14}$$

That is, about 0.55% or less of silicon can be mixed. Also, if $\Delta$Fit can be 10% or less of a pure film in which no atom other than the atom group 35 is mixed, about 5.5% of silicon can be mixed.

(b) Formation Positions of Protective Film

FIG. 15 is a sectional view showing the semiconductor device according to the second embodiment of the present invention. In the second embodiment as shown in FIG. 15, a protective film 41 made of a material containing at least one atom of the atom group 35 is formed on the lower surface (the surface opposite to the upper surface on which a semiconductor element is formed) of a silicon substrate 11.

Note that the protective film 41 can also be formed in positions described below, instead of the lower surface of the silicon substrate 11.

For example, as shown in FIG. 15, an element isolation region 42 having an STI structure formed in the silicon substrate 11 can be formed by the protective film. In this case, the element isolation region 42 is preferably made of at least an atom which belongs to the atom group 35 and functions as an insulator.

Also, as shown in FIG. 15, insulating films 43 and 44 formed on a MOSFET 14 and between interconnections can be formed by the protective film. In this case, the insulating films 43 and 44 are preferably made of at least an atom which belongs to the atom group 35 and functions as an insulator.

Furthermore, as shown in FIG. 15, interconnections 46a and 46b and contacts 45a and 45b connecting to source/drain diffusion layers 13a and 13b of the MOSFET 14 and an upper interconnection 47 can be formed by the protective film. In this case, the interconnections 46a, 46b, and 47 and contacts 45a and 45b are preferably made of at least a metal atom which belongs to the atom group 35 and functions as a conductor.

In addition, as shown in FIG. 15, a passivation film 48 formed on the uppermost interconnection above the MOSFET 14 can be formed by the protective film. In this case, the passivation film 48 is preferably made of at least an atom which belongs to the atom group 35 and functions as an insulator.

As shown in FIG. 16, it is also possible to form a protective film 51 on the side surfaces of a semiconductor chip 50 which mounts the semiconductor device shown in FIG. 15.

(c) Thickness of Protective Film

The thickness Y of the protective film 41 changes in accordance with the types and constitution ratio (composition) of atoms of the protective film material and the density of the material. In this embodiment, therefore, the thickness of the protective film is defined by studying the minimum film thickness necessary to inhibit α-rays. The protective film thickness is determined on the basis of α-rays because α-rays are light and hence have high ability to penetrate substances among other radioactive rays radiated from radioactive substances, and the energies of α-rays generated by fast neutrons contained in cosmic rays are high.

First, the typical energy of α-rays is presumably 1 to 11 MeV. Accordingly, assuming that a film thickness which inhibits a 1-MeV α-ray having the lowest energy is the minimum value, the thickness of the protective film 41 is defined to be larger than this minimum value. When the protective film 41 is made of polyimide, therefore, the polyimide protective film 41 preferably has a film thickness of about 2.1 μm or more in order to inhibit this 1-MeV α-ray.

Second, the energy of an α-ray emitted from a radioactive substance contained in, e.g., lead which is contained in solder often used in solder bumps and the like is presumably about 5.5 MeV. To inhibit this 5.5-MeV α-ray, therefore, the film thickness of the polyimide protective film 41 is favorably about 4.7 μm or more.

From the foregoing, the thickness Y of the protective film 41 is preferably 2 μm or more, and more preferably, 5 μm or more.

Note that this explanation is made by taking the protective film 41 formed on the lower surface of the silicon substrate 11 as an example. However, the thickness Y of the protective film 41 as described above is similarly applicable to protective films formed in other positions.

(d) Methods of Adhering Protective Film

The protective film 41 can be adhered by, e.g., a method using vacuum adhesion (technorise.ne.jp/item/02.html (hyperlink symbology omitted)), and a method written in "Rao R. Tsummala et. al. (supervised and translated by Kouyama), Microelectronics Packaging Handbook, Nikkei BP (1991), Chapter 6, Connection of Chip and Package".

Figure 17:
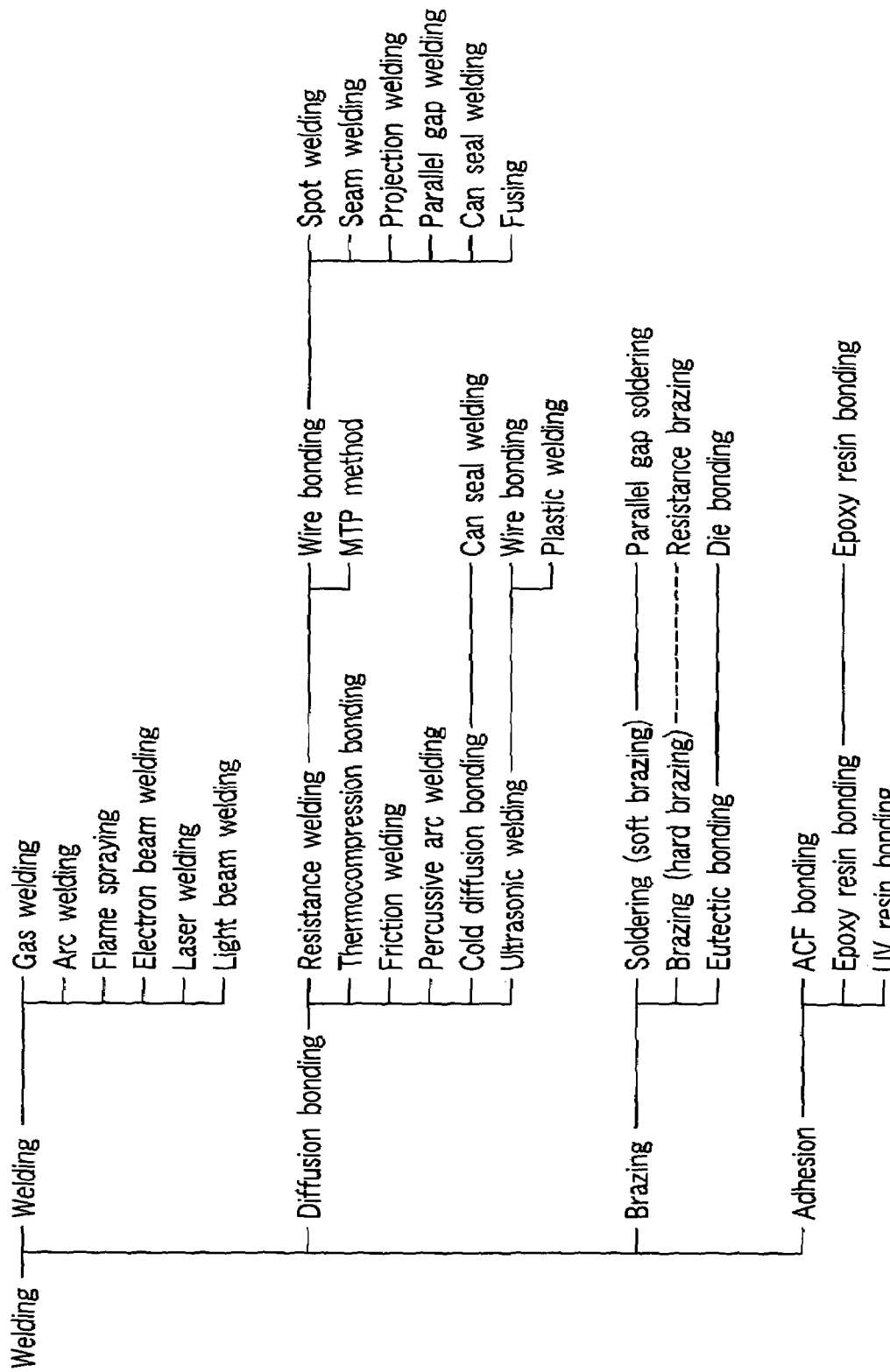
FIG. 17 is a view showing methods of adhering a protective film according to the second embodiment of the present invention.

To adhere (bond) objects to each other, atoms of these objects must be brought as near as an interatomic distance. When atoms are brought as near as an interatomic distance, objects are bonded by 1) chemical bond (metal bond), 2) covalent bond, 3) ionic bond, 4) physical bond, or 5) mechanical bond. An adsorption layer, oxide film, and the like are usually formed on the surface of an object. As shown in FIG. 17, known means for adhering objects by removing these obstacles are 1) welding, 2) diffusion bonding, 3) brazing, and 4) adhesion. For more detailed information of FIG. 17, refer to "avio.co.jp/poducts/assem/basic.pdf (hyperlink symbology omitted)", page 3.

In the second embodiment of the present invention, various such adhering methods can of course be performed in accordance with the material of the protective film 41. For example, die bonding is presumably a useful method. That is, desirable adhering methods according to the second embodiment are a) adhesion such as epoxy resin (including polyimide) bonding, and b) eutectic bonding.

(e) Materials for Adhering Protective Film

To adhere the protective film 41 to the silicon substrate 11 by using an adhesive, this adhesive is desirably made of a material containing at least one atom of the atom group 35.

As shown in FIG. 18, practical examples of the adhesive are epoxy and polyimide as disclosed in "Rao R. Tsummala et. al. (supervised and translated by Kouyama), Microelectronics Packaging Handbook, Nikkei BP (1991)", page 442, table 8-5.

If the silicon substrate 11 is relatively thick and requires substrate contacts, the use of a conductive adhesive is desirable. If the silicon substrate 11 is thin and no substrate contacts can be formed, the use of an insulating adhesive is desirable.

As described above, the second embodiment can achieve the following effects in addition to the same effects as in the first embodiment.

That is, in the second embodiment, the protective film 41 is formed on the lower surface of the silicon substrate 11 and functions as a reinforcing plate of the thin silicon substrate 11. In addition, the protective film 41 is made of a material containing at least one atom of the atom group 35. Therefore, even if a nuclear reaction occurs in the protective film 41, the generation of secondary particles 30 can be reduced.

Note that when a chip is to be packaged upside down as in the case of a flip chip, the protective film 41 can be formed on the side of the silicon substrate on which no element is formed.

[Third Embodiment]

In the third embodiment, the semiconductor device according to the first embodiment is formed on a lead frame.

Figure 19:
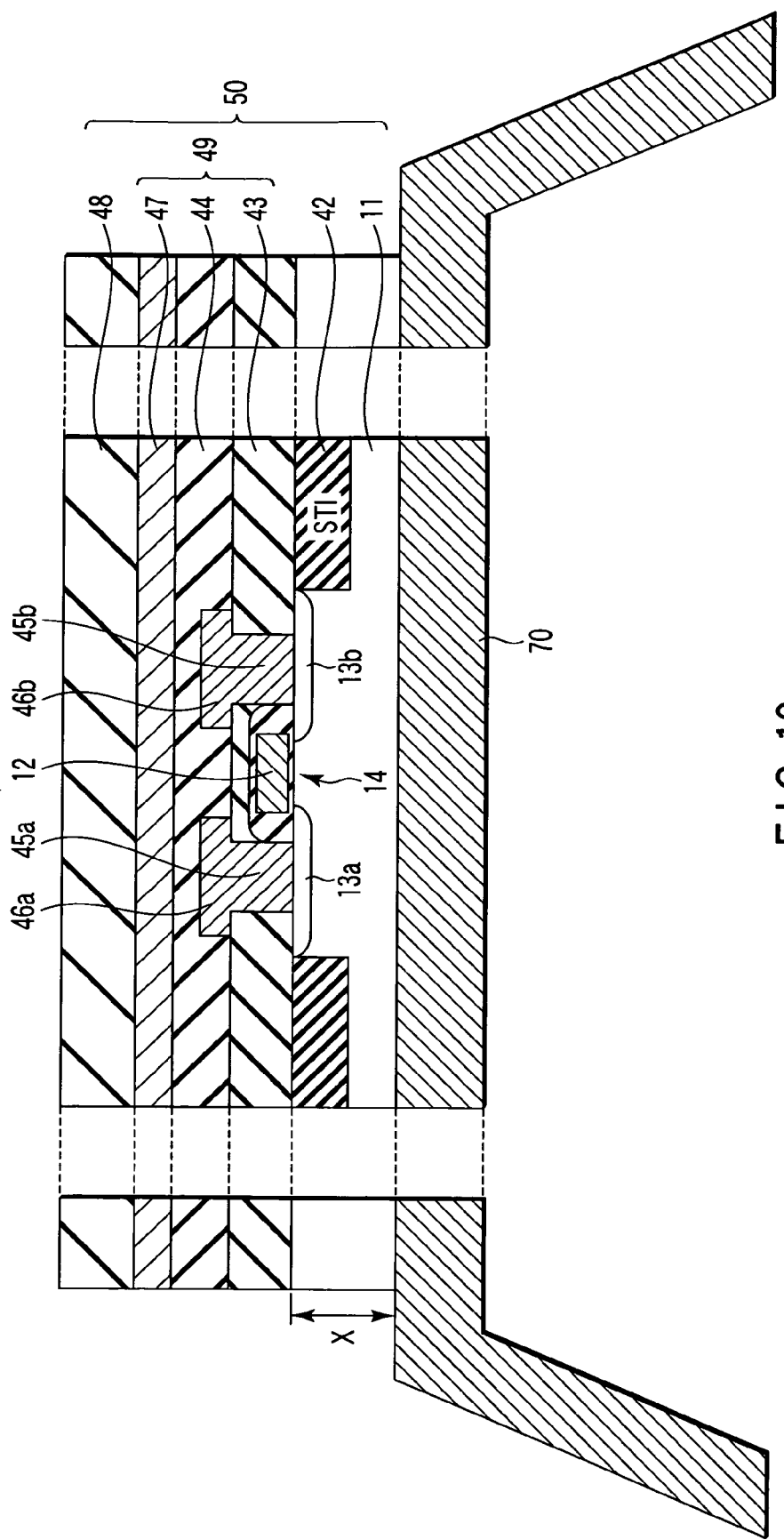
FIG. 19 is a sectional view showing a semiconductor device including a lead frame according to a third embodiment of the present invention.

FIG. 19 is a sectional view showing a semiconductor device having a lead frame according to the third embodiment of the present invention. In the third embodiment as shown in FIG. 19, a silicon substrate 11 is formed on a lead frame 70 without any oxide film, support substrate, or the like between them. The lead frame 70 is desirably made of a material containing at least one atom of an atom group 35 described previously.

The third embodiment as described above can achieve the same effects as in the first embodiment.

In the third embodiment, it is also possible to form a protective film 41 as described in the second embodiment between the lead frame 70 and silicon substrate 11. In this case, the lead frame 70 need not be formed by a material containing at least one atom of the atom group 35.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:
   a silicon substrate having a film thickness smaller than a maximum range of a particle generated by a nuclear reaction between a fast neutron and a silicon atom;
   a protective film formed to surround the silicon substrate, the protective film having a thickness approximately equal to the thickness of the silicon substrate, being made of at least one material containing atoms having an atomic number of 1 to 13, and being made of polyimide; and
   a semiconductor element formed on a surface of the silicon substrate.

2. The device according to claim 1, wherein the film thickness of the silicon substrate is not more than 30 µm.

3. The device according to claim 1, wherein the film thickness of the silicon substrate is 2 nm to 6 µm.

4. The device according to claim 1, wherein the film thickness of the silicon substrate is 0.5 µm.

5. The device according to claim 1, wherein the silicon substrate is an island-like substrate.

6. The device according to claim 1, further wherein the material of the protective film is an atom which does not cause any alpha decay.

7. The device according to claim 1, further wherein a film thickness of the protective film is not less than 2 µm.

8. The device according to claim 1, further wherein a film thickness of the protective film is not less than 5 µm.

9. The device according to claim 1, further comprising an element isolation region formed in the silicon substrate by at least one material containing atoms having an atomic number of 1 to 13.

10. The device according to claim 1, further comprising an insulating film formed on the semiconductor element and formed of at least one material containing atoms having an atomic number of 1 to 13.

11. The device according to claim 1, further comprising an interconnection made of at least one material containing atoms having an atomic number of 1 to 13, and electrically connected to the semiconductor element.

12. The device according to claim 1, further comprising a contact made of at least one material containing atoms having an atomic number of 1 to 13, and electrically connected to the semiconductor element.

13. The device according to claim 1, further comprising a passivation film formed above the semiconductor element, the passivation film including at least one material containing atoms having an atomic number of 1 to 13.

14. The device according to claim 1, further comprising an adhesive, made of at least one material containing atoms having an atomic number of 1 to 13, which adheres the protective film to the silicon substrate.

15. The device according to claim 14, wherein the adhesive is made of polyimide or epoxy.

16. The device according to claim 1, wherein the protective film and silicon substrate are adhered to each other by epoxy resin bonding or eutectic bonding.

17. The device according to claim 1, further comprising a lead frame formed on a lower surface of the silicon substrate and formed of at least one material containing atoms having an atomic number of 1 to 13.

18. A semiconductor device comprising:
    a silicon substrate having a film thickness smaller than a maximum range of a particle generated by a nuclear reaction between a fast neutron and a silicon atom;
    a protective film formed to surround the silicon substrate, the protective film having a thickness approximately equal to the thickness of the silicon substrate and being made of at least one material containing atoms having an atomic number of 1 to 13;
    a semiconductor element formed on a surface of the silicon substrate; and
    an adhesive, made of at least one material containing atoms having an atomic number of 1 to 13, which adheres the protective film to the silicon substrate.

19. The device according to claim 18, wherein the adhesive is made of polyimide or epoxy.

20. A semiconductor device comprising:
    a silicon substrate having a film thickness smaller than a maximum range of a particle generated by a nuclear reaction between a fast neutron and a silicon atom;
    a protective film formed to surround the silicon substrate, the protective film having a thickness approximately equal to the thickness of the silicon substrate and being made of at least one material containing atoms having an atomic number of 1 to 13; and
    a semiconductor element formed on a surface of the silicon substrate;
    wherein the protective film and silicon substrate are adhered to each other by epoxy resin bonding or eutectic bonding.

* * * * *